DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JULY 20, 1971

888 O.G. 705

T888,004
MINIMIZING DIFFERENTIAL SHRINKAGE OF MULTILAYER CERAMIC CIRCUIT BOARDS

William R. Keller, 3211 Kamerer Drive, Wilmington, Del. 19803

Filed Sept. 1, 1970, Ser. No. 68,757
Int. Cl. B32b *31/26;* C04b *39/00*
U.S. Cl. 156—89
No Drawing. 11 Pages Specification

In the process for producing multilayer ceramic circuit boards comprising laminating by firing two or more layers of green ceramic tape, wherein one or more surfaces of the layers of tape have electrical components printed thereon and wherein the green ceramic tape shrinks differentially in its width or x-axis direction as compared to its length or y-axis direction when fired, the improvement which comprises minimizing differential shrinkage of the circuit boards upon firing by stacking the layers of green tape alternately so that each successive layer has its x-axis direction aligned with the y-axis direction of the preceding layer. The green ceramic tape comprises finely divided ceramic particles and an organic binder therefor and is prepared by doctor blading an aqueous or organic dispersion of the ceramic particles and the binder, followed by eliminating the solvent, e.g., by drying. After stacking the layers of green tape in the above-described orientation, the layers are laminated, e.g., by heat or pressure, and then fired to sinter the ceramic layers and to remove the binder.